United States Patent [19]

Nishida et al.

[11] 4,219,756
[45] Aug. 26, 1980

[54] MOUNTING STRUCTURE OF A QUARTZ CRYSTAL UNIT

[75] Inventors: Isamu Nishida; Tadashi Otani; Kenji Yajima, all of Tokyo, Japan

[73] Assignee: Kabushiki Kaisha Daini Seikosha, Tokyo, Japan

[21] Appl. No.: 907,574

[22] Filed: May 19, 1978

[30] Foreign Application Priority Data

Jun. 7, 1977 [JP] Japan .......................... 52-73768[U]

[51] Int. Cl.² .......................................... H01L 41/10
[52] U.S. Cl. ............................. 310/348; 174/138 G;
310/344; 310/351; 361/418
[58] Field of Search ............... 310/345, 348, 351–356,
310/341–344; 361/404, 405, 400, 401, 417–419,
423, 430; 174/138 G; 248/27

[56] References Cited

U.S. PATENT DOCUMENTS

| 2,341,683 | 2/1944 | Bailey | 310/356 |
|---|---|---|---|
| 2,904,617 | 9/1959 | King | 174/138 G X |
| 3,154,281 | 10/1964 | Frank | 174/138 G |
| 3,163,393 | 12/1964 | Strong, Jr. | 361/418 X |
| 3,612,749 | 10/1971 | Grube, Jr. | 310/345 X |

FOREIGN PATENT DOCUMENTS 808494 2/1959 United Kingdom ................ 174/138 G

OTHER PUBLICATIONS

*Electronic Design,* Jan. 4, 1961, p. 114, Advertisement by IER Corporation.

*Primary Examiner*—Mark O. Budd
*Attorney, Agent, or Firm*—Robert E. Burns; Emmanuel J. Lobato; Bruce L. Adams

[57] ABSTRACT

A mounting structure for use with an electronic timepiece comprises a quartz crystal unit disposed within an opening formed in a circuit board and arranged so that the major lengthwise axis of the crystal unit lies parallel with the major plane of the circuit board. A connector formed of heat-deformable material connects the crystal unit to the circuit board and has a cup-shaped portion at one end which is clamped over and supports an end portion of the crystal unit, and a mounting stud at the other end which is inserted through a hole in the circuit board and secured thereto by heat-deforming the end tip of the stud which projects beyond the circuit board to form an enlarged head.

3 Claims, 5 Drawing Figures

MOUNTING STRUCTURE OF A QUARTZ CRYSTAL UNIT

BACKGROUND OF THE INVENTION

The present invention relates to a mounting structure of a quartz crystal unit on a circuit board.

Figure 1:
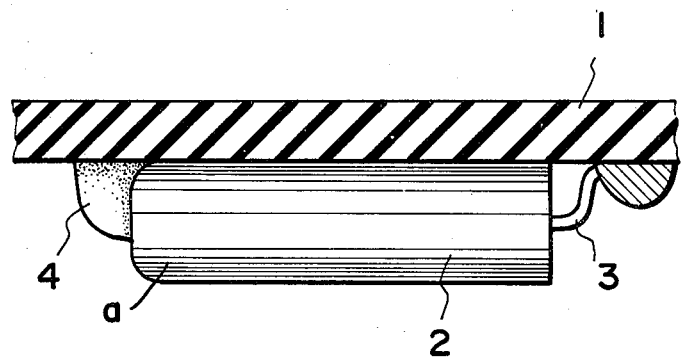
FIG. 1 is a longitudinal side view, partly in section, of a conventional type mounting structure.
Figure 2:
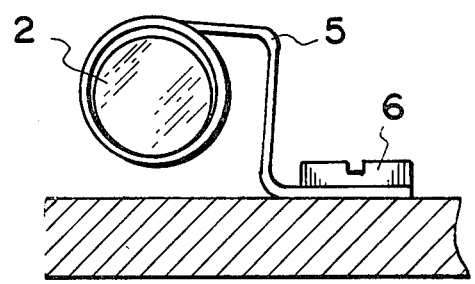
FIG. 2 is an end view, partly in section, of another type conventional mounting structure.

Conventionally, as shown in FIG. 1, a quartz crystal unit 2 is mounted on a circuit board 1 by adhering a lead wire 3 which extends from one end of the unit to the circuit board 1 by soldering or welding and the other end portion "a" of the quartz crystal unit 2 is adhered by an adhesive 4. And as shown in FIG. 2, a quartz crystal fixing plate 5 which suspends the quartz crystal unit 2 is fixed to a base plate or a bridge by a mounting screw 6.

However, in such a prior art mounting structure of a quartz crystal unit using adhesive, it takes a relatively long time for an adhesive to harden, moreover it is difficult to control the adhesive adhering strength. As a result, the manufacturing cost of such mounting structures becomes expensive and the mounting of the quartz crystal unit cannot be completed in a short time. Furthermore, the mounting structure using the technique of suspending the quartz crystal unit by a quartz crystal fixing plate is disadvantageous since the circuit board itself cannot be removed and also the mounting structure will be weakened if the mounting screw loosens or if the structure is subjected to shock.

Accordingly, the present invention provides a mounting structure of the quartz crystal unit which eliminates the above mentioned disadvantages.

Figure 3:
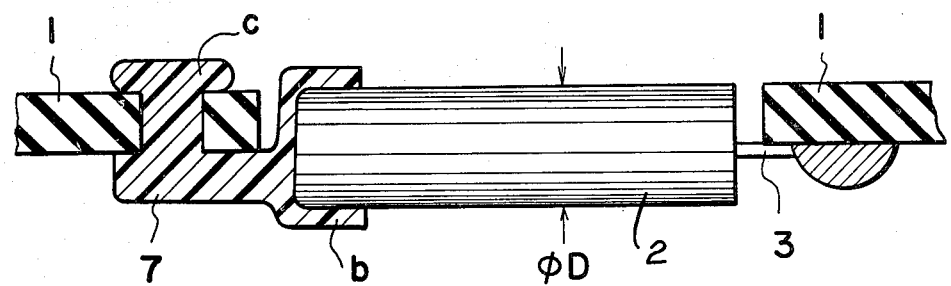
FIG. 3 is a longitudinal side view, partly in section, of one embodiment of mounting structure according to the invention.

FIG. 3 shows an embodiment of the present invention wherein a lead wire 3 extending from one end of a quartz crystal unit 2 is soldered to a circuit board 1. A quartz crystal connecting member of connector 7 is provided for connecting the other end of the quartz crystal unit 2 to the circuit board 1. The connecting member 7 is composed of heat-deformable material having electrically insulative properties such as commercially available thermoplastic materials. One end of the connecting member 7 has a cup-shaped portion "b" for clamping over and supporting the end of the quartz crystal unit 2 and the other end of the connecting member 7 has a mounting stud "c" for insertion through a hole in the circuit board 1.

Figure 4:
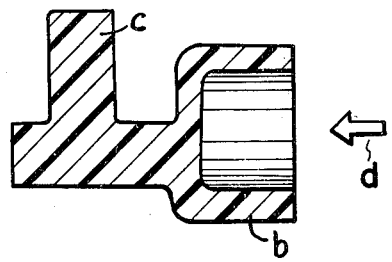
FIG. 4 is a side sectional view of a connecting member of the mounting structure before attachment to the circuit board.
Figure 5:
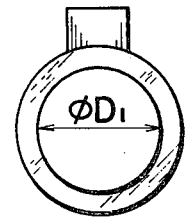
FIG. 5 is an end view of the connecting member shown in FIG. 4.

FIG. 4 shows a side view of the connecting member 7 and FIG. 5 shows an end view thereof as seen from a "d" direction of FIG. 4, before attachment to the circuit board 1. As shown, the inner diameter dimension $\phi D_1$ of the cylindrical cupped portion "b" is made slightly smaller than the outer diameter dimension $\phi D$ of the quartz crystal unit 2. This enables the cup-shaped portion "b" to be clamped over the end of the quartz crystal unit 2 with a tight fit, due to the differences in diameters, and results in a good mechanical connection between the connecting member 7 and quartz crystal unit 2. The connecting member 7 is secured to the circuit board 1 by inserting the mounting stud "c" into the hole in the circuit board and then applying heat to the end tip of the stud which projects beyond the circuit board so as to form an enlarged head by heat-deforming the stud end tip thereby rigidly connecting the connecting member 7 to the circuit board 1 thereby mounting the quartz crystal unit 2 to the circuit board. As a result, the quartz crystal unit 2 is rigidly fixed to the circuit board 1 and with good shock resistance from external shocks.

In accordance with the construction of the present invention, the a quartz crystal unit is fixed to the circuit board and, it is not necessary to worry about loosening of mounting screws or damage due to shocks. Moreover, the circuit board itself can be easily removed. Furthermore, since the quartz crystal unit is first attached to the connecting member and then connected to the circuit board, the time taken to manufacture the assembled mounting structure is shortened in comparison with the conventional mounting structure.

Accordingly, the quartz crystal unit can be mounted on the circuit board rigidly in a short time and at a relatively low cost.

We claim:

1. A mounting structure of a quartz crystal unit mounted on a circuit board for use in electronic timepieces and the like comprising: a circuit board having an opening therein; an elongate quartz crystal unit having a set of terminals projecting from one end thereof and disposed within said opening and positioned such that the major axis of said quartz crystal unit lies parallel with the major plane of said circuit board; a solder connection connecting said terminals to said circuit board thereby rigidly fixing one end of said quartz crystal unit to said circuit board; and a connecting member connecting the other end of said quartz crystal unit to said circuit board, said connecting member having a cup-shaped portion disposed within the circuit board opening and clamped over said other end of said quartz crystal unit for supporting said quartz crystal unit and having a mounting stud inserted in a hole in said circuit board and secured thereto thereby securing said connecting member to said circuit board.

2. A mounting structure according to claim 1; wherein said connecting member is composed of, heat-deformable material; and wherein said hole extends completely through said circuit board, and said mounting stud extends completely through said hole and has its end tip projecting beyond said circuit board with the projecting end tip being heat-deformed into an enlarged head thereby securing said connecting member to said circuit board.

3. A mounting structure according to claim 1; wherein said cup-shaped portion of said connecting member has a shape complementing that of the quartz crystal end portion to which it is clamped, the inner dimension of said cup-shaped portion being slightly smaller than the outer dimension of said quartz crystal end portion thereby obtaining a tight fit between the two.

* * * * *